United States Patent
Trombert

(10) Patent No.: US 11,650,229 B2
(45) Date of Patent: May 16, 2023

(54) FLUXGATE CURRENT TRANSDUCER

(71) Applicant: LEM INTERNATIONAL SA, Meyrin (CH)

(72) Inventor: Stéphan Trombert, Leschaux (FR)

(73) Assignee: LEM International SA, Meyrin (CH)

( * ) Notice: Subject to any disclaimer, the term of this patent is extended or adjusted under 35 U.S.C. 154(b) by 0 days.

(21) Appl. No.: 17/769,139

(22) PCT Filed: Oct. 16, 2020

(86) PCT No.: PCT/EP2020/079288
§ 371 (c)(1),
(2) Date: Apr. 14, 2022

(87) PCT Pub. No.: WO2021/078655
PCT Pub. Date: Apr. 29, 2021

(65) Prior Publication Data
US 2022/0357366 A1 Nov. 10, 2022

(30) Foreign Application Priority Data
Oct. 22, 2019 (EP) .................... 19204733

(51) Int. Cl.
*G01R 33/04* (2006.01)
*G01R 15/18* (2006.01)
(Continued)

(52) U.S. Cl.
CPC .......... *G01R 15/185* (2013.01); *G01R 33/02* (2013.01); *G01R 33/04* (2013.01); *G01R 33/045* (2013.01); *G01R 33/05* (2013.01); *G01R 33/0206* (2013.01)

(58) Field of Classification Search
CPC .... G01R 15/185; G01R 33/04; G01R 33/045; G01R 33/02; G01R 33/05; G01R 33/0206
(Continued)

(56) References Cited

U.S. PATENT DOCUMENTS

2009/0058410 A1 3/2009 Baturin
2009/0230955 A1* 9/2009 Kejik ..................... G01R 33/04
324/253
(Continued)

OTHER PUBLICATIONS

International Search Report and Written Opinion as issued by the European Patent Office, dated Jan. 20, 2021, for International Patent Application No. PCT/EP2020/079288; 14 pages.
(Continued)

*Primary Examiner* — Raul J Rios Russo
(74) *Attorney, Agent, or Firm* — Faegre Drinker Biddle & Reath LLP

(57) ABSTRACT

Fluxgate current transducer including a fluxgate device comprising a saturable soft magnetic core and an excitation coil, and a processing circuit comprising a control circuit and a voltage generator connected to the control circuit for generating an alternating current in the excitation coil, the voltage generator generating a voltage oscillating between a maximum positive voltage (+U) and a maximum negative voltage (−U) configured to alternatingly saturate the soft magnetic core. The signal processing circuit comprises an overload circuit portion connected to the control circuit, configured to generate overload currents through the excitation coil over time windows (Tn) after detection of the excitation coil current reaching positive and negative threshold currents (+S3, −S3) representative of saturation of the magnetic core, during at least one of a plurality of alternating voltage periods (P).

12 Claims, 7 Drawing Sheets

(51) Int. Cl.
*G01R 33/02* (2006.01)
*G01R 33/05* (2006.01)

(58) Field of Classification Search
USPC ............ 324/51, 55, 200, 227, 228, 244, 253
See application file for complete search history.

(56) References Cited

U.S. PATENT DOCUMENTS

| | | |
|---|---|---|
| 2009/0315536 A1 | 12/2009 | Koch |
| 2011/0006753 A1 | 1/2011 | Yu |
| 2012/0139527 A1* | 6/2012 | Teppan ................ G01R 15/185 |
| | | 324/127 |
| 2014/0009146 A1* | 1/2014 | Blagojevic ............ G01R 33/07 |
| | | 324/252 |
| 2014/0055131 A1* | 2/2014 | Rybalko ................ G01R 33/04 |
| | | 324/253 |
| 2014/0210463 A1* | 7/2014 | Klein ................ G01R 33/0052 |
| | | 324/253 |
| 2019/0377009 A1* | 12/2019 | Plagne ................ G01R 15/185 |

OTHER PUBLICATIONS

International Preliminary Report on Patentability as issued by the European Patent Office, dated Jul. 5, 2021, for International Patent Application No. PCT/EP2020/079288; 12 pages.

* cited by examiner

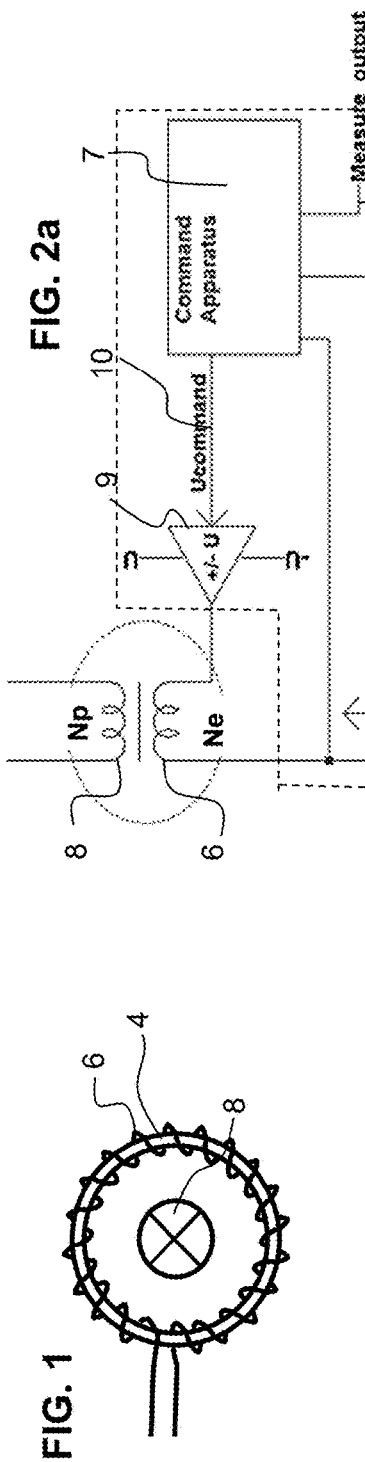
FIG. 1
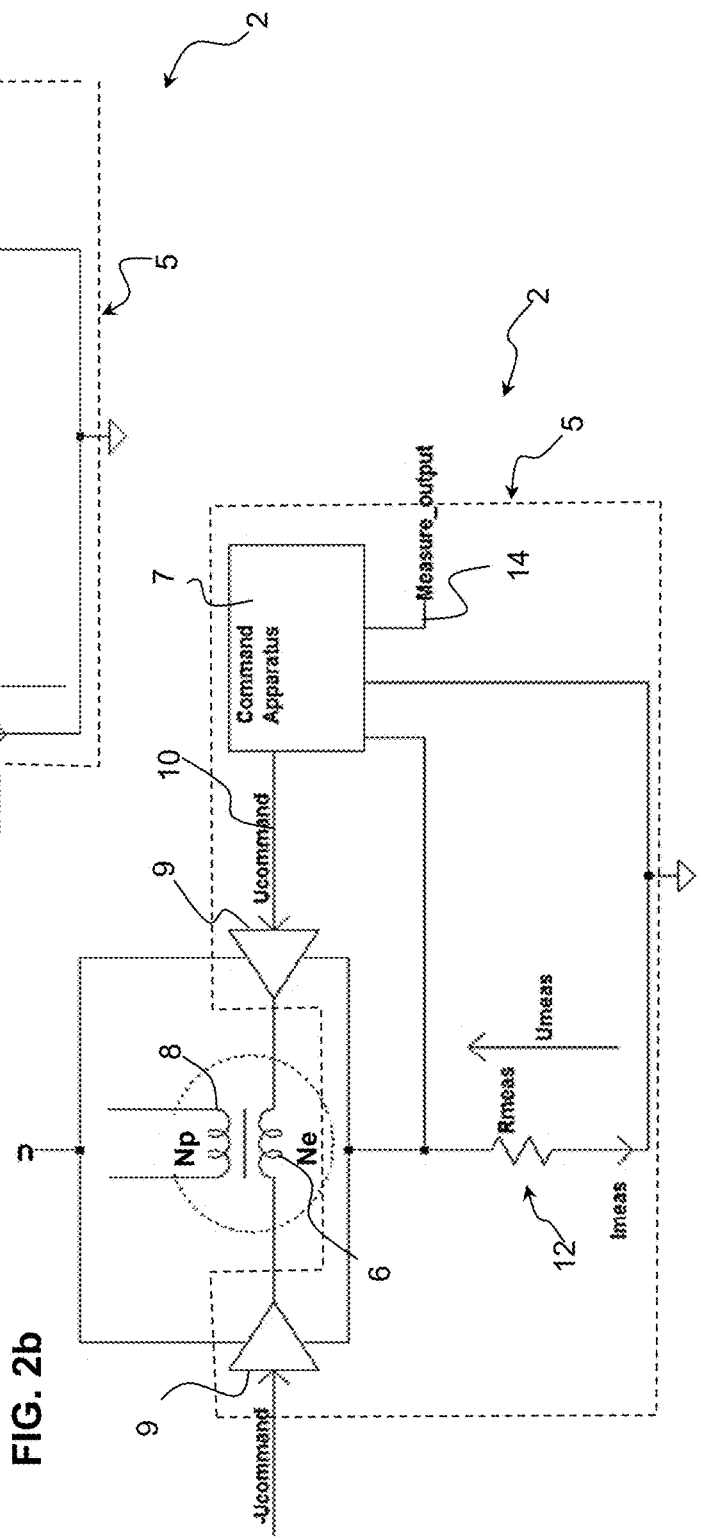
FIG. 2a
FIG. 2b

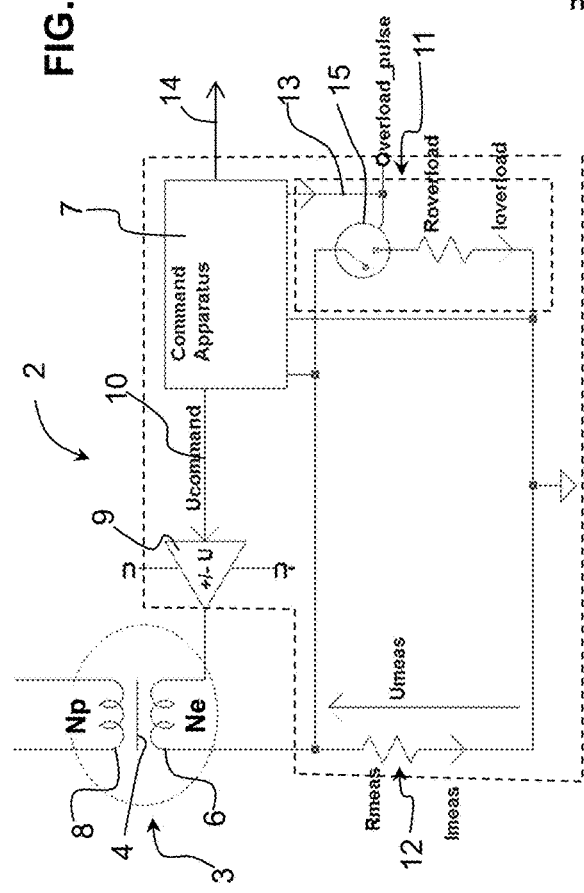
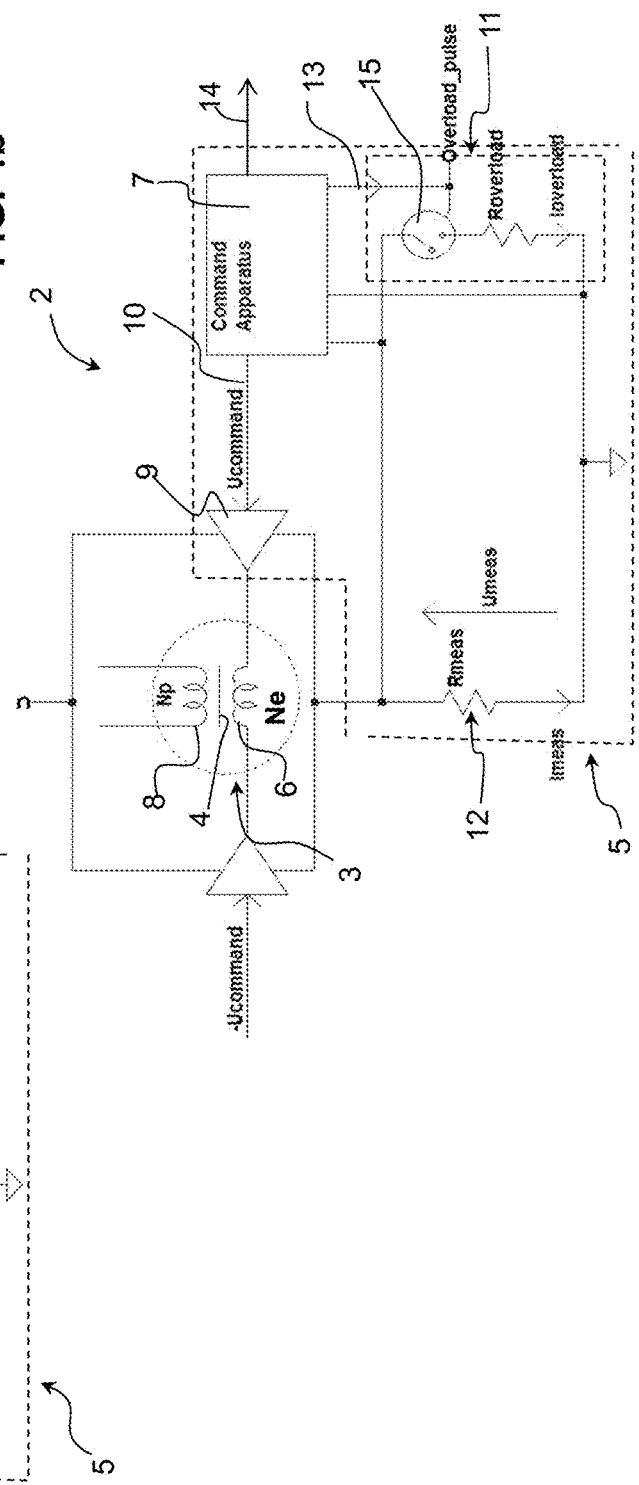

FLUXGATE CURRENT TRANSDUCER

CROSS-REFERENCE TO RELATED APPLICATIONS

The present application is a national stage entry of International (PCT) Patent Application Number PCT/EP2020/079288, filed Oct. 16, 2020, which claims priority to European Patent Application Number 19204733.0, filed Oct. 22, 2019, the complete disclosures of which are expressly incorporated herein by reference.

The present invention relates to a fluxgate current transducer and a method of operating a fluxgate current transducer.

Fluxgate current transducers are well known and used in many current sensing applications. A fluxgate current transducer typically comprises a magnetic field detector having a saturable soft magnetic core 4 surrounded by an excitation coil 6 with Ne turns (see FIG. 1). The excitation coil is magnetically coupled to a compensation coil or primary coil 8 having Np turns. This arrangement has the characteristics of a transformer. In many fluxgate transducers, a primary conductor carrying a current to be measured extends through the central passage of the magnetic field detector. In closed-loop transducers, there is a compensation coil magnetically coupled to the magnetic field detector and connected in a feedback circuit to a signal processing circuit, the compensation coil seeking to cancel the magnetic field generated by the primary conductor. Such an arrangement is well known. It is also possible to use the fluxgate in an open-loop manner whereby there is no compensation coil and only a primary conductor carrying the current to be measured (represented by the primary coil 8). In view of the high sensitivity of fluxgate magnetic field detectors, they are however mainly used in a closed-loop configuration.

Various circuit configurations are known for a fluxgate current transducer as illustrated for instance in FIGS. 2a and 2b. Typically, such transducers comprise a control circuit 7 that generates a voltage control output 10 to a voltage generator 9 that outputs a substantially square oscillating excitation coil voltage. The substantially square or trapezoidal voltage signal oscillates between a maximum negative value −U' and a maximum positive value +U' as illustrated in FIG. 3.

The excitation coil voltage alternatingly saturates the soft magnetic core 4 of the fluxgate device 3, whereby the saturation affects the timing t1', t2' of a duty cycle. A magnetic field, such as produced by the primary conductor carrying a current to be measured, causes the saturable soft magnetic core to saturate in one direction quicker than in the other direction, thus causing an asymmetry in the duration of the positive and negative voltage signals. The ratio of durations t1'/t2' provides a measurement of the amplitude of the external magnetic field and thus can be used to determine the amplitude and direction of the current to be measured. Such principles are well known.

As best seen with reference to FIG. 3 which depicts the absolute value (or rectified current value) of the excitation coil current for an external field that is substantially 0, during the initial stage S1' of a half period, the excitation coil current Imeas is rising until the stage S2' where the magnetic core goes into saturation until a threshold point S3' where the control circuit detects a threshold saturation and reverses the voltage of the voltage generator 9 supplying the excitation coil 6.

In order to increase sensitivity of the transducer, the resistance of the measurement resistor Rmeas may be increased, however a consequence is that the excitation coil current Imeas, for a given maximum absolute value U' of the excitation coil, voltage is decreased. The saturation threshold point S3' should be set lower for a higher resistance value of the measurement resistor. Increasing the resistance value of the measurement resistor thus reduces the magnitude of the alternating saturation of the magnetic core 4.

When a surge in the external magnetic field (for instance due to a current surge in the primary conductor) having a magnitude well above the fluxgate transducer measurement capability occurs, a remnant magnetic field in the magnetic core 4 may be generated. Reducing the magnitude of the alternating saturation of the magnetic core 4 by lowering the excitation current may however lead to a situation where the magnitude of the alternating saturation field is insufficient to completely remove the remnant magnetic field in the core, thus leading to an offset of the measurement output.

An object of the invention is to provide a fluxgate current transducer, and a method of operating a fluxgate current transducer, that is accurate and reliable yet resilient to magnetic field surges and other situations that may cause offset in the measurement output of the transducer.

It is advantageous to provide a fluxgate current transducer that is cost effective and reliable.

It is advantageous to provide a fluxgate current transducer that is easy to install and operate.

Objects of the invention have been achieved by providing a fluxgate current transducer according to claim 1 and method of operating a fluxgate current transducer according to claim 8.

Disclosed herein is a fluxgate current transducer including a fluxgate device comprising a saturable soft magnetic core and an excitation coil, and a signal processing circuit comprising a control circuit and a voltage generator connected to the control circuit for generating an alternating current in the excitation coil. The voltage generator generates a voltage oscillating between a maximum positive voltage and a maximum negative voltage configured to alternatingly saturate the soft magnetic core. The signal processing circuit comprises an overload circuit portion connected to the control circuit, configured to generate overload currents through the excitation coil over time windows after detection of the excitation coil current reaching positive and negative threshold currents representative of saturation of the magnetic core, during at least one of a plurality of alternating voltage periods, the overload current having the same polarity as the excitation coil current in the same alternating voltage period.

In an advantageous embodiment, said overload circuit portion comprises a switch and an overload resistor connected in parallel to a measuring resistor of the processing circuit, the control circuit being configured to generate overload pulse signals that close the switch during said time windows.

In an advantageous embodiment, the control circuit is configured to generate overload pulse signals having a constant value time window.

In an advantageous embodiment, the control circuit is configured to generate overload pulse signals having a variable value time window.

In an advantageous embodiment, the variable value time windows include successively decreasing value time windows.

In an advantageous embodiment, the control circuit is configured to generate overload pulse signals over one or more periods separated by one or more periods of excitation voltage without overload pulses.

In an advantageous embodiment, the control circuit is provided in any of a field programmable gate array (FPGA), microprocessor, microcontroller or ASIC.

Also disclosed herein is a method of operating a fluxgate current transducer including a fluxgate device comprising a saturable soft magnetic core and an excitation coil, and a signal processing circuit comprising a control circuit and a voltage generator connected to the control circuit for generating an alternating current in the excitation coil, the voltage generator generating a voltage oscillating between a maximum positive voltage (+U and a maximum negative voltage (−U) configured to alternatingly saturate the soft magnetic core, wherein the control circuit generates overload pulse signals currents that actuate an overload circuit portion connected to the control circuit to generate overload pulse signals through the excitation coil over time windows after detection of the excitation coil current reaching positive and negative threshold currents representative of saturation of the magnetic core, said overload pulse signals being generated during at least one of a plurality of alternating voltage periods of the voltage generator, the overload current having the same polarity as the excitation coil current in the same alternating voltage period.

In an advantageous embodiment, the control circuit generates overload pulse signals having a constant value time window.

In an advantageous embodiment, the control circuit generates overload pulse signals having a variable value time window.

In an advantageous embodiment, the variable value time windows include successively decreasing value time windows.

In an advantageous embodiment, the control circuit generates overload pulse signals over one or more periods separated by one or more periods of excitation voltage without overload pulses.

Further objects and advantageous features of the invention will be apparent from the claims, from the detailed description, and annexed drawings, in which:

FIG. 1 is a schematic simplified view of a conventional fluxgate measuring head of a fluxgate current transducer;

FIGS. 2a and 2b show schematic circuit diagrams of conventional fluxgate current transducers;

FIGS. 4a and 4b show schematic circuit diagrams of fluxgate current transducers according to embodiments of the invention;

Figure 3:
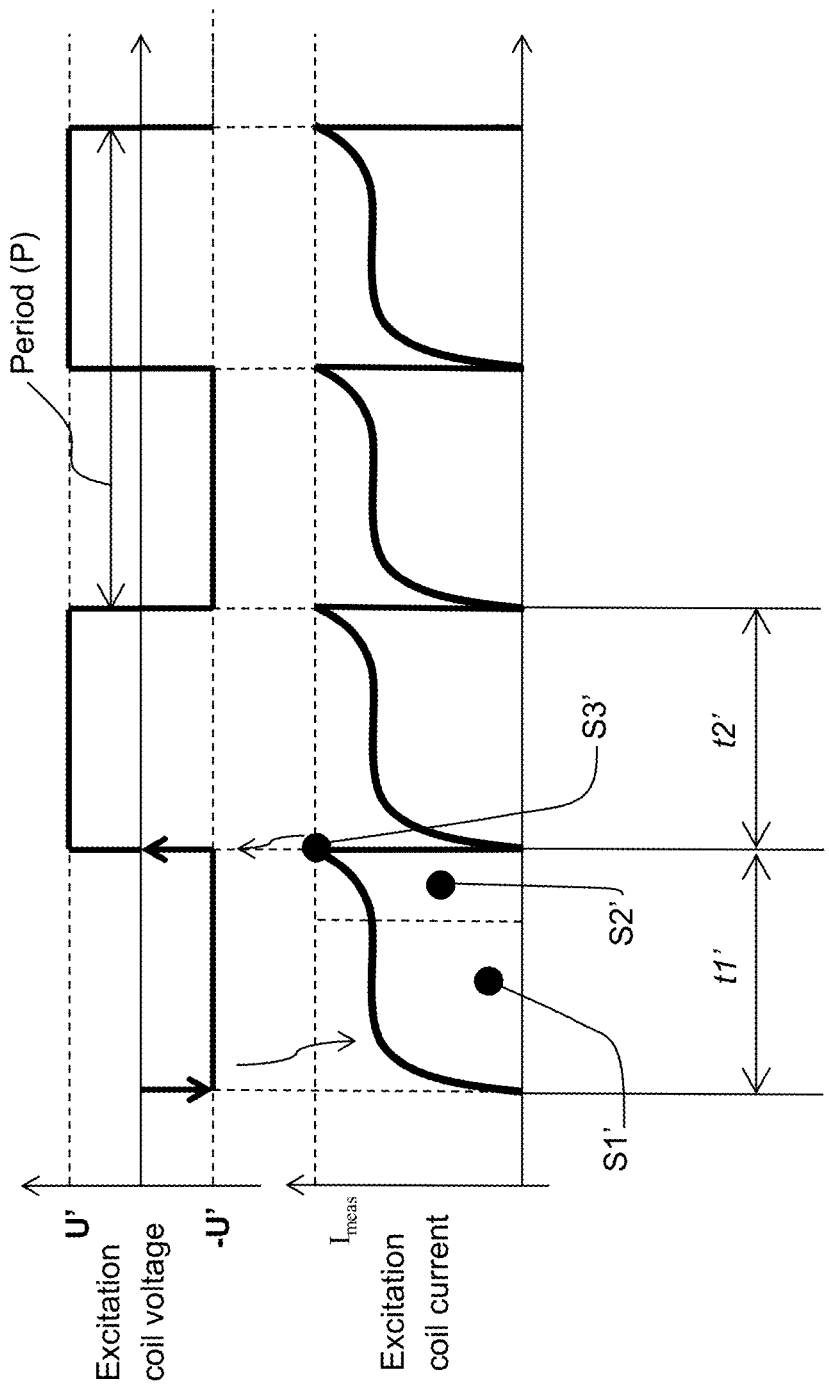
FIG. 3 shows plots of voltage, respectively current, over time in an excitation coil of a conventional fluxgate current transducer.

Referring to FIGS. 4a and 4b, a fluxgate current transducer 2 according to an embodiment of the invention comprises a magnetic field detector in a form of a fluxgate measuring head 3, and a signal processing circuit 5 connected to the fluxgate measuring head.

The fluxgate measuring head 3 may have various configurations per se known in the field of fluxgate magnetic field detectors, such configurations comprising at least a saturable soft magnetic core 4 and an excitation coil 6 wound around the magnetic core with Ne turns.

The fluxgate current transducer may further comprise a compensation coil with Np turns 8 that magnetically couples to the excitation coil 6 and saturable soft magnetic core 4. The compensation coil 8 may be connected in a feedback loop to the processing circuit 5 in order to generate a magnetic field that seeks to cancel the magnetic field generated by a primary conductor carrying a current to be measured. The principle of the aforedescribed closed loop fluxgate transducer is per se well known and need not be described in detail herein.

In an alternative embodiment, the fluxgate current transducer may be an open loop transducer without a compensation coil in which case the coupling between the excitation coil 6 and saturable soft magnetic core 4 couples directly to a primary conductor 8 in which the current to be measured flows. The primary conductor 8 may pass directly through the central passage of the magnetic core and excitation coil or may have a plurality of number of turns represented by the number Np.

The processing circuit 5 comprises a command or control circuit 7 and a voltage generator 9.

The control circuit 7 comprises a voltage control output 10 that controls the voltage generator 9 in order to produce an alternating voltage signal for the excitation coil. The processing circuit further comprises an excitation coil measurement circuit 12 and a transducer measurement output 14 that outputs a measurement signal for a user. The measurement signal output by the control circuit represents a value of the primary current flowing in a primary conductor that the transducer aims to measure.

The general circuit layout as illustrated in FIGS. 2a and 2b are per se known, and other per se known fluxgate circuit layouts may be used within the scope of this invention. According to the invention, the signal processing circuit further comprises an overload pulse circuit portion 11 and the control circuit 7 is configured to generate an overload pulse control signal that actuates via a switching device 15 an injection of overload current $I_{overload}$ through the excitation coil 6. The switching device 15 can be controlled by a logic signal output by the control circuit 7 and a resistor $R_{overload}$. When the switching device is closed the measurement resistor $R_{meas}$ is in parallel with the resistor $R_{overload}$ thus reducing the resistance of the circuit through the excitation coil ($1/R_{circuit}=1/R_{meas}+1/R_{overload}$) and causing an increase in current through the excitation coil to generate an overload current.

The processing circuit 5 may for instance be implemented in an FPGA (Field Programmable Gate Array) as per se well known in the field of signal processing circuits. In other embodiments the processing circuit 5 may also be implemented in a microprocessor, microcontroller or ASIC (Application Specific Integrated Circuit).

Figure 5A:
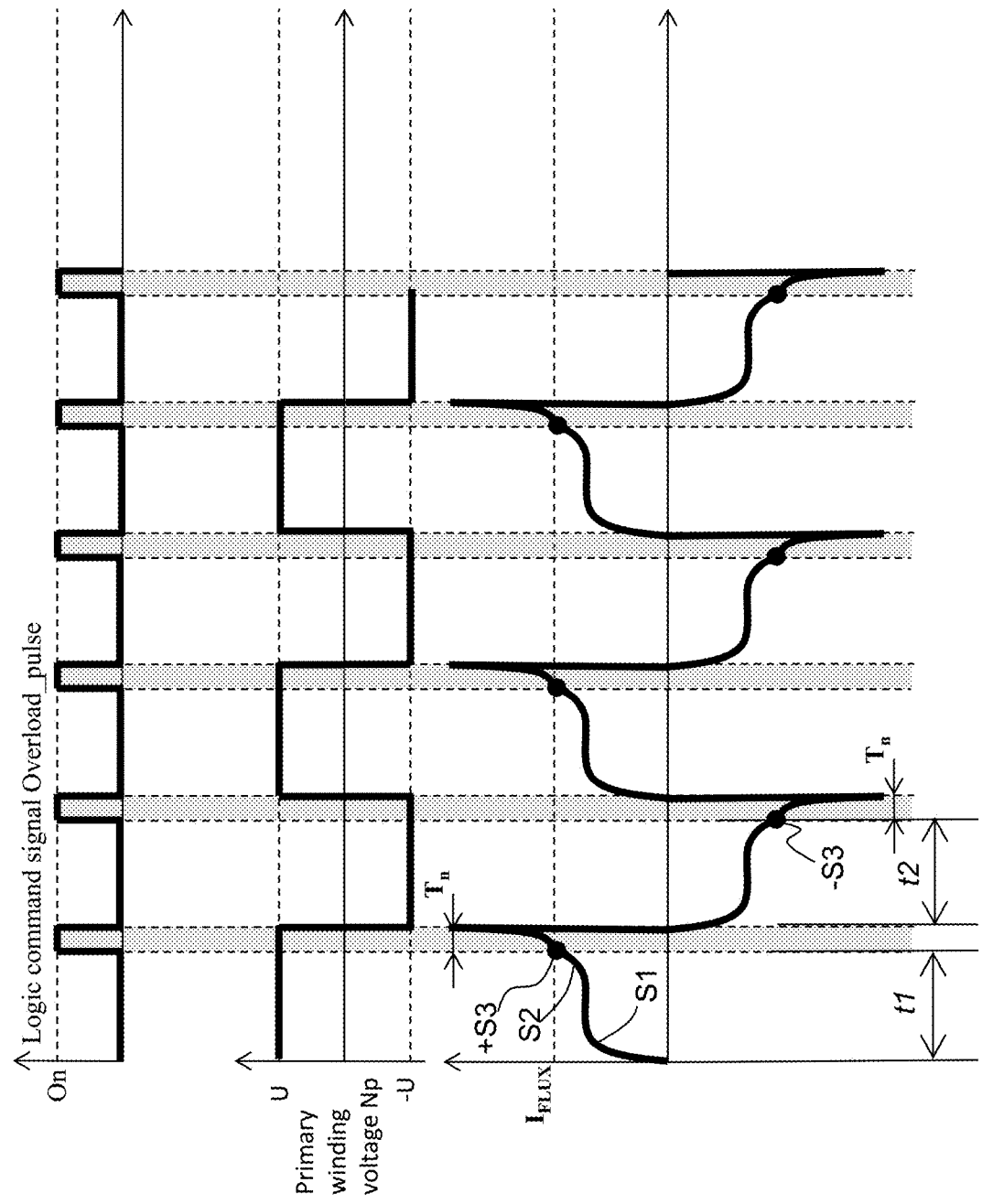
FIGS. 5a to 5c shows plots of voltage, respectively current, over time in an excitation coil of a fluxgate current transducer according to embodiments of the invention, where FIGS. 5a, 5b and 5c variants with different overload pulse command signals.

As best seen in FIG. 5a, when the voltage is switched to a maximum amplitude of +U or −U during an initial stage S1 the current Iflux in the excitation coil rises until the magnetic core 4 goes into saturation during the stage S2 until it reaches a threshold S3 detected by the control circuit 7. From this threshold point S3, the control circuit 7 generates an overload pulse control signal during a time Tn that closes the switch 15. During this Tn time window the current in the fluxgate excitation coil Iflux increases to a level determined by the overload resistance $R_{overload}$ connected in parallel to the measurement resistance $R_{meas}$. The overload pulse signal is generated at least once in each current direction, namely for the positive current driven +Imeas by the positive voltage +U and for the negative current −Imeas driven by the negative voltage −U in order to ensure that a high magnetic saturation field is applied in both directions on the soft magnetic core in order to remove any remnant magnetic field that may be present in the core.

The fundamental frequency of the oscillating excitation voltage signal U may remain the same with overload pulses as without overload pulses. However, in a variant, it is also possible to modify the fundamental frequency of the excitation voltage to accommodate the overload pulse currents.

The current shape of the initial stage S1 and second stage S2 going into saturation until the threshold S3 may also remain the same with and without overload pulses. The latter allows the measurement of the duty cycle to output a value of the primary current being measured that is not affected by the overload pulse currents in the time window Tn. In the computation of the primary current value from the measurement of the times to saturation t1, t2, the time component Tn may either be removed, not included, or accounted for in the computation.

Figure 5B:
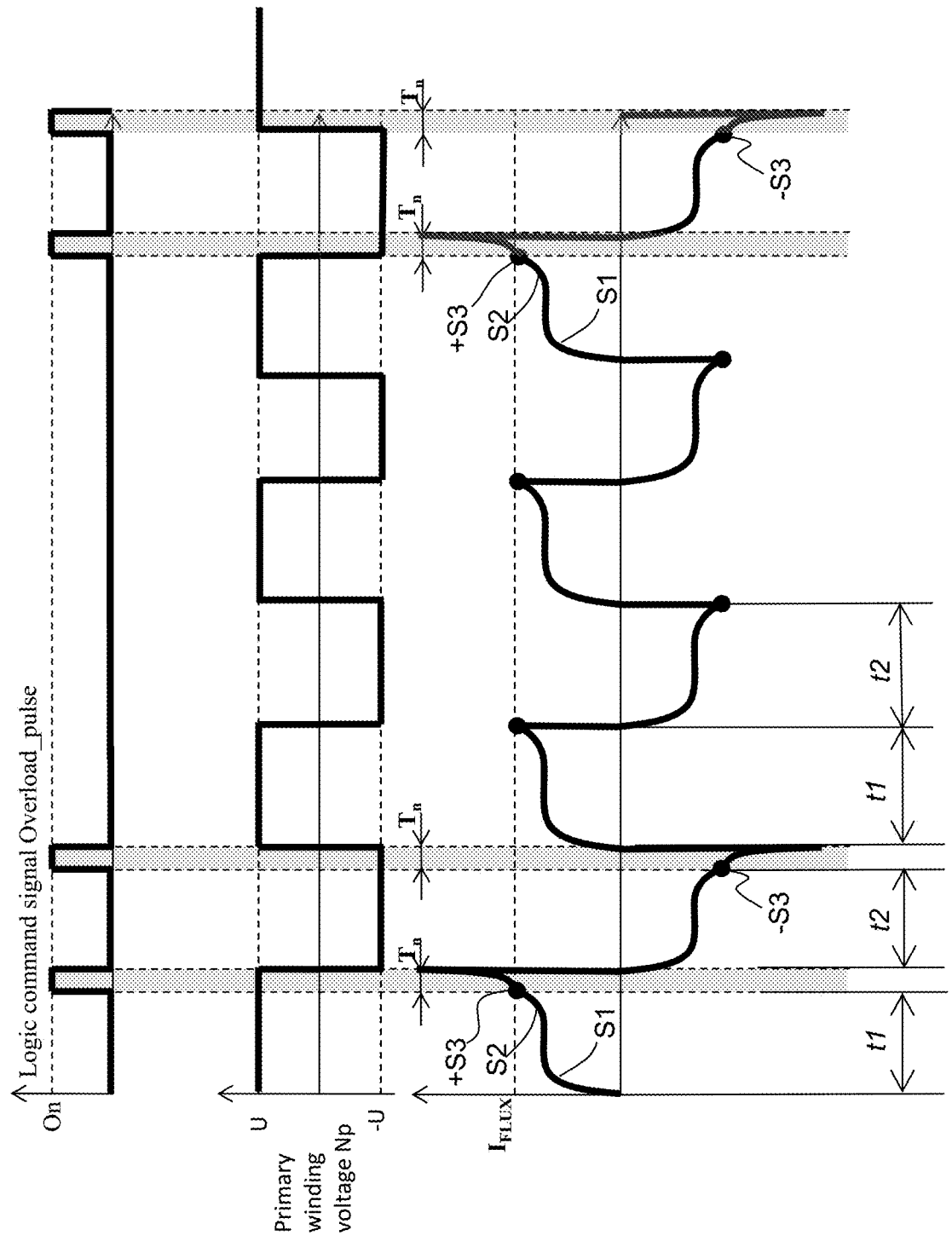
Figure 5C:
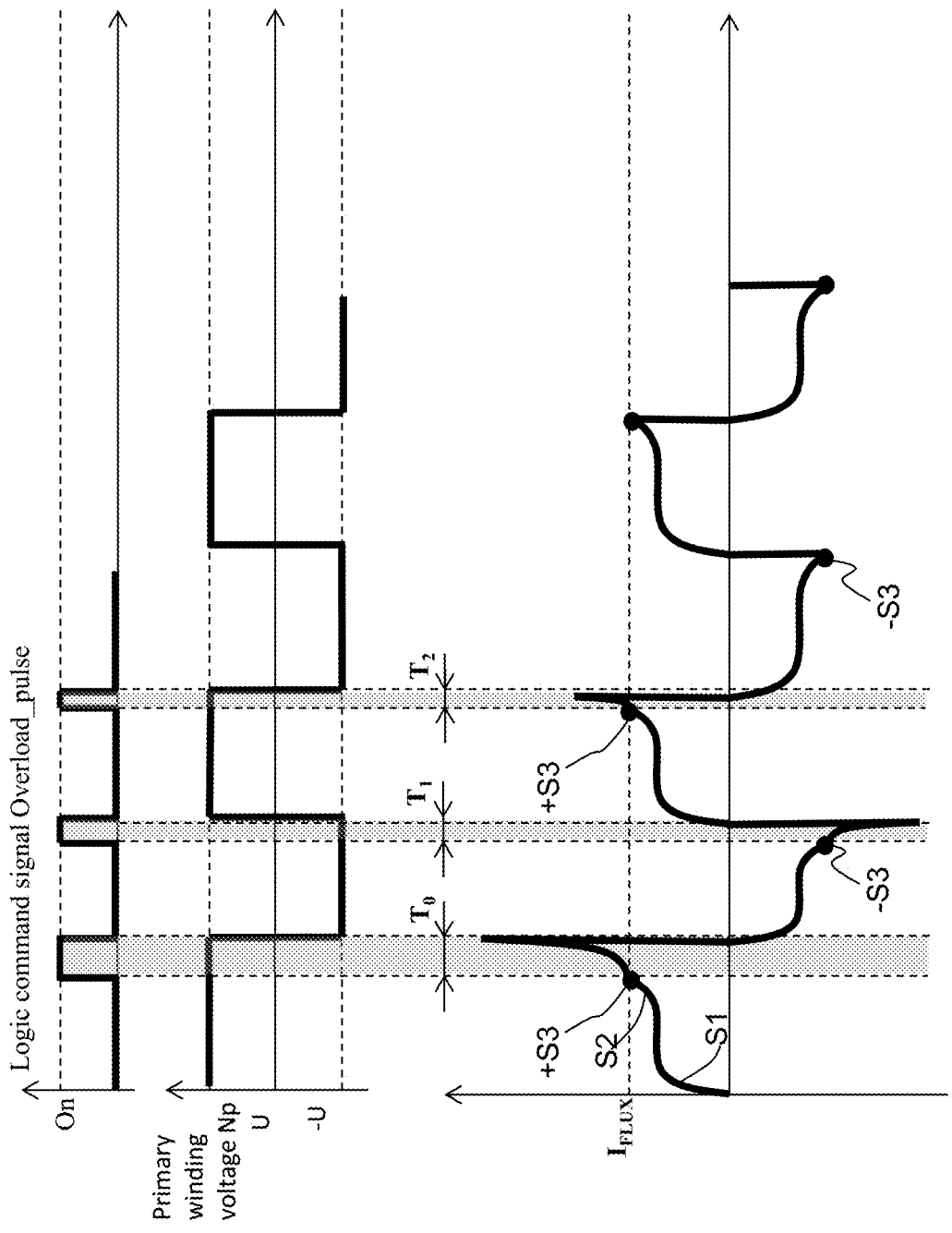
Figure 6:
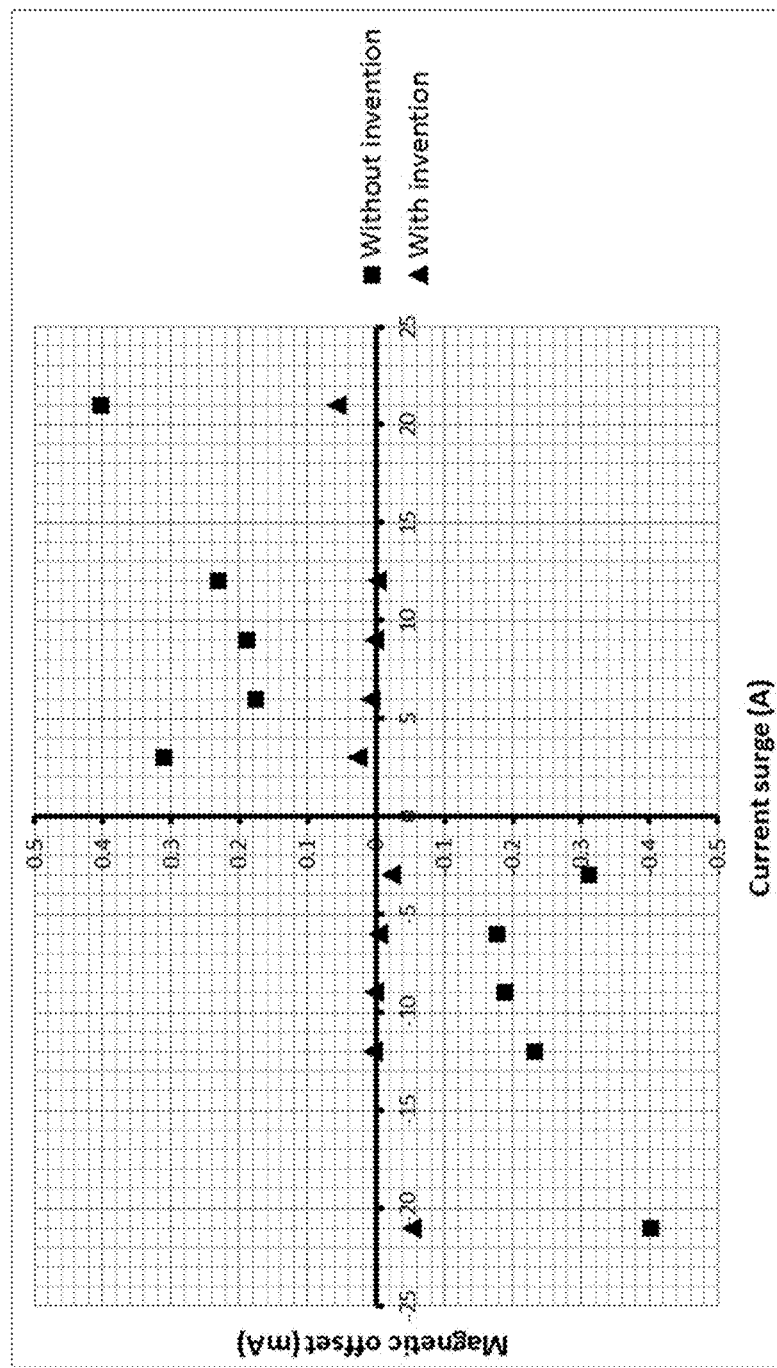
FIG. 6 shows a plot of magnetic offset versus primary currents surges for a conventional current transducer and for a current transducer according to an embodiment of the invention.

In the embodiment illustrated in FIG. 5a the control circuit generates a logic overload pulse signal at each positive threshold +S3 and each negative threshold −S3. The logic overload pulse signal may be generated at every oscillation, or for one or more periods interrupted by one or more periods with no overload pulse signals, for instance as illustrated in FIG. 5b. Intermittent overload pulse signals may be generated by the control circuit in a regular predefined manner, or may be generated stochastically. Overload pulse signals may have a fixed or constant time window Tn, as illustrated in the embodiments of FIGS. 5a and 5b, or may have varying time windows T0, T1, T2 as illustrated in FIG. 5c. Combinations of varying time windows and continuous or intermittent overload pulse signals may be generated within the scope of the invention.

The varying time pulse signal as illustrated in FIG. 5c preferably has a successively decreasing time window T2<T1<T0 such that the absolute value of the amplitude of saturation, which is dependent of the excitation current Imeas, decreases over successive pulses so as to eliminate or reduce any remanence that may be created by the overload pulse currents themselves by providing a progressively decreasing alternating saturation.

A fluxgate transducer according to the invention thus enables the use of a high resistance measuring resistor for greater sensitivity in the measurement of the excitation current Imeas while avoiding measurement errors due to offset created by remanence in the soft magnetic core of the excitation coil.

LIST OF FEATURES

Fluxgate current transducer 2
　Fluxgate device 3
　　Saturable soft magnetic core 4
　　Excitation coil (Ne winding) 6
　　Compensation coil or primary coil (Np winding) 8
　Processing circuit 5
　　Command circuit 7
　　　Voltage control output 10
　　　Excitation coil measurement circuit 12
　　　　Measurement resistor $R_{meas}$
　　　Overload circuit portion 11
　　　　Overload pulse output 13
　　　　Switch 15
　　　　Overload resistor $R_{overload}$
　　　Measurement output 14
　　Voltage generator 9
　　Excitation coil current $I_{meas}$
　　Overload pulse current $I_{overload}$

The invention claimed is:

1. A fluxgate current transducer including a fluxgate device comprising a saturable soft magnetic core and an excitation coil, and a signal processing circuit comprising a control circuit and a voltage generator connected to the control circuit for generating an alternating current in the excitation coil, the voltage generator generating a voltage oscillating between a maximum positive voltage (+U) and a maximum negative voltage (−U) configured to alternatingly saturate the saturable soft magnetic core, wherein the signal processing circuit comprises an overload circuit portion connected to the control circuit, configured to generate overload currents through the excitation coil over time windows (Tn) after detection of the excitation coil current reaching positive and negative threshold currents (+S3, −S3) representative of saturation of the saturable soft magnetic core, during at least one of a plurality of alternating voltage periods (P), the overload current generated after detection of the saturation of the saturable soft magnetic core in a same alternating voltage period having the same polarity as the excitation coil current in said same alternating voltage period.

2. The fluxgate current transducer according to claim 1, wherein said overload circuit portion comprises a switch and an overload resistor ($R_{overload}$) connected in parallel to a measuring resistor ($R_{meas}$) of the processing circuit, the control circuit being configured to generate overload pulse signals that close the switch during said time windows (Tn).

3. The fluxgate current transducer according to claim 1, wherein the control circuit is configured to generate overload pulse signals having a constant value time window.

4. The fluxgate current transducer according to claim 1, wherein the control circuit is configured to generate overload pulse signals having a variable value time window.

5. The fluxgate current transducer according to claim 4, wherein the variable value time windows include successively decreasing value time windows (T0, T1, T2).

6. The fluxgate current transducer according to claim 1, wherein the control circuit is configured to generate overload pulse signals over one or more periods separated by one or more periods of excitation voltage without overload pulses.

7. The fluxgate current transducer according to claim 1, wherein the control circuit is provided in any of a field programmable gate array (FPGA), microprocessor, microcontroller or ASIC.

8. Method A method of operating a fluxgate current transducer including a fluxgate device comprising a saturable soft magnetic core and an excitation coil, and a signal processing circuit comprising a control circuit and a voltage generator connected to the control circuit for generating an alternating current in the excitation coil, the voltage generator generating a voltage oscillating between a maximum positive voltage (+U) and a maximum negative voltage (−U) configured to alternatingly saturate the saturable soft magnetic core, wherein the control circuit generates overload pulse signals currents that actuate an overload circuit portion connected to the control circuit to generate overload pulse signals through the excitation coil over time windows (Tn) after detection of the excitation coil current reaching positive and negative threshold currents (+S3, −S3) representative of saturation of the saturable soft magnetic core, said overload pulse signals being generated during at least one of a plurality of alternating voltage periods (P) of the voltage generator, the overload current generated after detection of the saturation of the saturable soft magnetic core in a same alternating voltage period having the same polarity as the excitation coil current in said same alternating voltage period.

9. The method of operating a fluxgate current transducer according to claim 8, wherein the control circuit generates overload pulse signals having a constant value time window.

10. The method of operating a fluxgate current transducer according to claim 8, wherein the control circuit generates overload pulse signals having a variable value time window.

11. The method of operating a fluxgate current transducer according to claim 10, wherein the variable value time windows include successively decreasing value time windows (T0, T1, T2).

12. The method of operating a fluxgate current transducer according to claim 8, wherein the control circuit generates overload pulse signals over one or more periods separated by one or more periods of excitation voltage without overload pulses.

\* \* \* \* \*

UNITED STATES PATENT AND TRADEMARK OFFICE
CERTIFICATE OF CORRECTION

PATENT NO. : 11,650,229 B2
APPLICATION NO. : 17/769139
DATED : May 16, 2023
INVENTOR(S) : Stéphan Trombert It is certified that error appears in the above-identified patent and that said Letters Patent is hereby corrected as shown below:

In the Claims

Column 6 Line 50 Claim 8 should be amended to read:
8. A method of operating a fluxgate current transducer including a fluxgate device comprising a saturable soft magnetic core and an excitation coil, and a signal processing circuit comprising a control circuit and a voltage generator connected to the control circuit for generating an alternating current in the excitation coil, the voltage generator generating a voltage oscillating between a maximum positive voltage (+U) and a maximum negative voltage (-U) configured to alternatingly saturate the saturable soft magnetic core, wherein the control circuit generates overload pulse signals currents that actuate an overload circuit portion connected to the control circuit to generate overload pulse signals through the excitation coil over time windows (Tn) after detection of the excitation coil current reaching positive and negative threshold currents (+S3, –S3) representative of saturation of the saturable soft magnetic core, said overload pulse signals being generated during at least one of a plurality of alternating voltage periods (P) of the voltage generator, the overload current generated after detection of the saturation of the saturable soft magnetic core in a same alternating voltage period having the same polarity as the excitation coil current in said same alternating voltage period.

Signed and Sealed this
Eleventh Day of July, 2023

Katherine Kelly Vidal
*Director of the United States Patent and Trademark Office*